US011307241B2

(12) United States Patent
Sorensen et al.

(10) Patent No.: US 11,307,241 B2
(45) Date of Patent: Apr. 19, 2022

(54) MAINTAINING STABLE OPTICAL OUTPUT OF SOLID STATE ILLUMINATION SYSTEM

(71) Applicant: Excelitas Canada, Inc., Vaudreuil-Dorion (CA)

(72) Inventors: Erik Sorensen, Mississauga (CA); Douglas MacDonald, Milton (CA); Paul Constantinou, Burlington (CA); Yong Wang, Markham (CA)

(73) Assignee: Excelitas Canada, Inc., Mississauga (CA)

( * ) Notice: Subject to any disclaimer, the term of this patent is extended or adjusted under 35 U.S.C. 154(b) by 16 days.

(21) Appl. No.: 16/964,020

(22) PCT Filed: Jan. 24, 2019

(86) PCT No.: PCT/US2019/014890

§ 371 (c)(1), (2) Date: Jul. 22, 2020

(87) PCT Pub. No.: WO2019/147763

PCT Pub. Date: Aug. 1, 2019

(65) Prior Publication Data

US 2021/0037624 A1 Feb. 4, 2021

Related U.S. Application Data

(60) Provisional application No. 62/622,208, filed on Jan. 26, 2018.

(51) Int. Cl.

*G01R 31/26* (2020.01)
*H05B 45/18* (2020.01)

(Continued)

(52) U.S. Cl.

CPC ......... *G01R 31/2635* (2013.01); *G02B 21/06* (2013.01); *G02B 21/16* (2013.01);

(Continued)

(58) Field of Classification Search

CPC ........ H05B 45/10; H05B 45/37; H05B 45/00; H05B 45/325; H05B 47/185; H05B 45/22

See application file for complete search history.

(56) References Cited

U.S. PATENT DOCUMENTS

2006/0186819 A1* 8/2006 Young .................... H05B 45/24 315/158
2007/0040512 A1 2/2007 Jungwirth et al.

(Continued)

FOREIGN PATENT DOCUMENTS

EP 1349609 8/2005
WO 2004014110 2/2004

OTHER PUBLICATIONS

International Search Report for PCT/US19/14890, dated Jul. 26, 2019.

*Primary Examiner* — Wei (Victor) Y Chan

(74) *Attorney, Agent, or Firm* — Peter A. Nieves; Sheehan Phinney Bass & Green PA

(57) ABSTRACT

A method is disclosed for maintaining a desired optical output in a solid state illumination device, where the device is configured to accommodate multiple light emitting diodes (LEDs) and to combine light from the LEDs to produce a single optical output. The method includes testing the LEDs before adding them into the device. The testing produces characterizing information that describes how one or more optical properties (e.g., optical power and/or peak wavelength) of the tested LED change with temperature. This characterizing information is stored in a computer-based memory of the device, and the tested LED is added (connected) into the device. Then, during operation, temperature sensors measure a temperature associated with each respective LED in the device, and electrical current to one or more (Continued)

of the LEDs can be adjusted based on the measured temperatures associated with each LED and its stored characterizing information.

19 Claims, 5 Drawing Sheets

(51) Int. Cl.
*G02B 21/06* (2006.01)
*G02B 21/16* (2006.01)
*G01N 21/64* (2006.01)

(52) U.S. Cl.
CPC ......... *H05B 45/18* (2020.01); *G01N 21/6458* (2013.01); *G01N 2201/12707* (2013.01)

(56) References Cited

U.S. PATENT DOCUMENTS

2008/0238341 A1* 10/2008 Korcharz ............... H05B 45/22 315/297
2009/0079360 A1* 3/2009 Shteynberg ............ H05B 45/24 315/291
2014/0291557 A1* 10/2014 Harbers ................. G01N 21/17 250/578.1

* cited by examiner

MAINTAINING STABLE OPTICAL OUTPUT OF SOLID STATE ILLUMINATION SYSTEM

CROSS-REFERENCE TO RELATED APPLICATIONS

This application is the National Stage of International Application No. PCT/US19/14890, filed Jan. 24, 2019, which claims the benefit of U.S. Patent Application No. 62/622,208, filed Jan. 26, 2018. The contents of these prior applications are incorporated by reference herein in their entirety.

FIELD OF THE INVENTION

This disclosure relates to a feedback system for a solid state illumination system and, more particularly, relates to a feedback system that helps maintain a stable optical output in a solid state illumination system.

BACKGROUND

Molecular diagnostics refers generally to a collection of techniques that can be used to analyze biological markers in an individual's genetic code by applying molecular biology to medical testing. Some of these techniques can help diagnose or monitor disease, detect risk, and decide which therapies will work best for individual patients. Some of these techniques involve fluorescent microscopy.

Generally speaking, in fluorescent microscopy, a sample to be studied is illuminated and observed under an optical microscope that uses fluorescence or phosphorescence, for example. Traditionally, a skilled laboratory technician would perform a subjective, qualitative assessment of the sample by reviewing the images produced at the optical microscope. Light was needed to perform this procedure, but, since the assessment was subjective and qualitative, the light really only needed to be bright enough to effectively resolve the features of interest in the sample being studied.

More recently, fluorescent microscopy has moved toward a high degree of automation. As such, the involvement of and reliance on the subjective skill of a particular laboratory technician to produce a useful assessment, has become less desirable and less practical.

SUMMARY OF THE INVENTION

In one aspect, a method is disclosed for maintaining a desired optical output in a solid state illumination device, where the device is configured to accommodate multiple light emitting diodes (LEDs) and to combine light from the LEDs to produce a single optical output. The method includes testing the LEDs before adding them into the device. The testing produces characterizing information that describes how one or more optical properties (e.g., optical power and/or peak wavelength) of the tested LED change with temperature. This characterizing information is stored in a computer-based memory of the device, and the tested LED is added (connected) into the device. Then, during operation, temperature sensors measure a temperature associated with each respective LED in the device, and electrical current to one or more of the LEDs can be adjusted based on the measured temperatures associated with each LED and its stored characterizing information.

In another aspect, a solid state illumination device with a highly-stable optical output is disclosed. The device includes multiple light emitting diodes (LEDs) configured to produce light at different wavelengths (wavelength ranges), multiple controllable electrical current sources (each one being configured to provide electrical current to a corresponding one of the LEDs), multiple other optical elements (e.g., optical filters, etc.) arranged to filter and/or direct light from each respective one of the light emitting diodes along a corresponding light path toward a single optical output of the illumination system, multiple temperature sensors (each one configured to measure a temperature associated with a corresponding one of the LEDs), a computer-based memory that stores characterizing information that describes how one or more optical properties (e.g., optical power and/or peak wavelength) of each respective one of the LEDs in the solid state illumination device change with temperature, and a computer-based processor. The computer-based processor is configured to: determine, based on one or more temperature measurements and based on the characterizing information for one or more of the LEDs, an amount by which electrical current to a LED should be adjusted in view of a change in temperature; and cause a corresponding one of the controllable electrical current sources to adjust the electrical current to its corresponding LED based on the determination.

In some implementations, one or more of the following advantages are present.

For example, the systems and techniques disclosed herein provide for improved optical stability, which is believed to be unmatched by other technologies. This improved optical stability is achieved at low cost, by implementing and relying, at least in part, on mathematical characterizations & algorithms. The systems and techniques provide for a fast response. In some implementations, speed of response can be further enhanced by utilizing a voltage measurement (e.g., across each LED) instead of, and as a representation of, a temperature measurement associated with each LED. Moreover, in a typical implementation, the monitoring (e.g., of temperatures) can be constant, and, thus, the adjustments can be constant. Additionally, the adjustments can be performed, in some instances, based on pre-loaded set points (if using temperature, e.g.). Also, an LED does not have to be ON to 'preload' an appropriate LED current setting for a next experimental sequence initiated by the diagnostic instrument. Additionally, presented herein is a novel concept for delivering repeatable optical energy to a sample under test for improved quantitative analysis.

Moreover, over the last couple of decades in vitro diagnostics (IVD) has become standard in molecular diagnostics. With billions of samples per year to be analyzed worldwide, much of lab medicine has moved to industrial scale sample processing. At the same time the variety of conditions to be analyzed, the number of available assays, and the expectation of diagnostic accuracy have grown. Consequently, it has become desirable for today's instruments, particularly in molecular diagnostics, to be extremely sensitive, highly efficient, diagnostically accurate, and repeatable from sample-to-sample or exposure-to-exposure. In various implementations, the systems and techniques disclosed herein go a long way toward satisfying that desire.

Additionally, the systems and techniques disclosed herein can take full advantage of the benefits of utilizing solid state light lighting technology. This technology has progressed significantly in recent years and some high brightness light sources using solid state Light Emitting Devices (LEDs), e.g. light emitting diodes, are now available that can potentially provide sufficiently high radiance, broadband illumination for replacement of conventional arc lamps. Solid state LED light sources can offer advantages over conventional arc lamps, such as, improved lifetime, lower cost of ownership, lower voltage operation, lower power consumption and freedom from mercury. Additionally LED light sources can be readily controlled electronically, by modulating the current or voltage driving the device, which allows for fast switching and intensity control through the LED driver, which can be a significant advantage in many high throughput applications. LED technology is an enabling technology for many advancing diagnostic instrumentation because the long lifetime, compact size and lower temperature allows the light source to be designed into the instrument. As demand for greater functionality in a single diagnostic instrument increases, LED light sources become even more important because the optical spectrum (brightness & range) can be optimized beyond that of more conventional arc lamp systems. However, LED based systems also present a challenge where superior accuracy and repeatability are required. In this regard, the optical efficiency of an LED, for example, is not constant over temperature. This results in short timescale optical power variations after the LED turns on as well as fluctuations in output proportional or at least related to the ambient temperature of the system. Over much longer timescales the optical power of the LED tends to slowly decrease. The techniques and systems disclosed herein facilitate delivery of a constant optical energy in a sample the light source system by compensating for these factors.

What further complicates matters is that not only does the optical power vary with temperature; the center wavelength of an LED also varies with temperature. This can become a significant problem when other optical elements in the light source system are wavelength dependent such as dichroic and bandpass filters. LEDs provide a good match to emission bands of fluorescent diagnostic channels, as their FWHM ranging from 15-30 nm from UV to near IR is in the order of magnitude of the filter bandwidths. The width of single-pass bandpass filter is usually 20-30 nm wide. Still, such filters are needed in combination with LEDs in order to provide a clear and clean cut-off between the emission wavelength in a particular channel and the expected corresponding fluorescent spectral output of a sample under test. In a typical implementation, the system and techniques disclosed herein monitor and adjust the total optical power of an illumination system and take into account spectral change of the LEDs and combined optical output.

Wavelength drift or $d\lambda/dT$ should be considered when excitation filters are included in the optical system. By nature LEDs have a wider bandwidth than a laser system ~15-20 nm, comparable to the bandwidth of a typical excitation filter. As a result, the light intensity transmitted through the filter will vary depending on the temperature of the LED. Rather than measure only the change in optical power over temperature, the spectral response of each LED is characterized as a function of temperature. This response combined with the excitation filter spectrum come into play to correct for temperature variation (either intrinsic to the LED as it reaches thermal equilibrium or as a result of ambient temperature swings). A multi-variable feedback system such as described is able to compensate for an ambient $\Delta T$ of approximately 25° C., or more.

Finally, in some implementations, the systems and techniques disclosed herein achieve <+/−1% power stability over a wide ambient temperature range.

Other features and advantages will be apparent from the description and drawings, and from the claims.

BRIEF DESCRIPTION OF THE DRAWINGS

Like reference characters refer to like elements.

DETAILED DESCRIPTION

As fluorescent microscopy, and other diagnostic techniques that use light, have moved toward higher degrees of automation, the need for a solid state illumination device that produces a consistent and/or repeatable output light (i.e., one with consistent and/or repeatable optical characteristics, such as optical power, blend of wavelengths, etc.) has become highly desirable.

Solid state illumination devices, however, can be very sensitive to variations in temperature, making consistency and repeatability difficult to achieve, particularly when the system is experiencing changes in temperature. In this regard, a system's light emitting diodes (LEDs) and other optical components (e.g., dichroic filters, bandpass filters, etc.) can be sensitive to variations in temperature. For example, with an LED, the optical power being produced by the LED at a particular current level can change as temperature changes. Similarly, the wavelengths being produced by the LED can shift as temperature changes. With the other optical components in the system, such as dichroic filters, bandpass filters, etc., a change in temperature might shift the operational parameters for that component (e.g., the cutoff frequencies for a bandpass filter, etc.).

During operation in a typical solid state illumination device, the system experiences many temperature changes that can make system consistency and/or repeatability, with respect to optical power and/or wavelength being produced by the system, difficult to achieve. For example, during and shortly after system start-up, the LEDs, and other optical components in the system, typically experience a rapid increase in temperature. Then, depending in part on the system's capacity to dissipate heat, temperatures continue to rise, albeit more slowly, until the system reaches something of an equilibrium. Of course, any changes in ambient temperature (e.g., as an external air conditioning system cycles off and on) can affect the temperature of the solid state illumination device. Moreover, component degradation can affect the temperature of the solid state illumination device as well. Other factors may affect the temperature of the solid state illumination device too.

Each of these temperature changes that occur during system operation has the potential to affect system performance (i.e., to reduce consistency and/or repeatability in terms of optical characteristics, such as optical power and/or wavelengths being produced at the system output). In a typical implementation, the systems and techniques disclosed herein help improve system performance considerably, despite changes in operational temperature, and help to avoid, or at least minimize, undesirable variations in optical power and/or wavelengths being produced by the solid state illumination device, and instead help ensure consistency and repeatability in lighting system performance.

Figure 1:
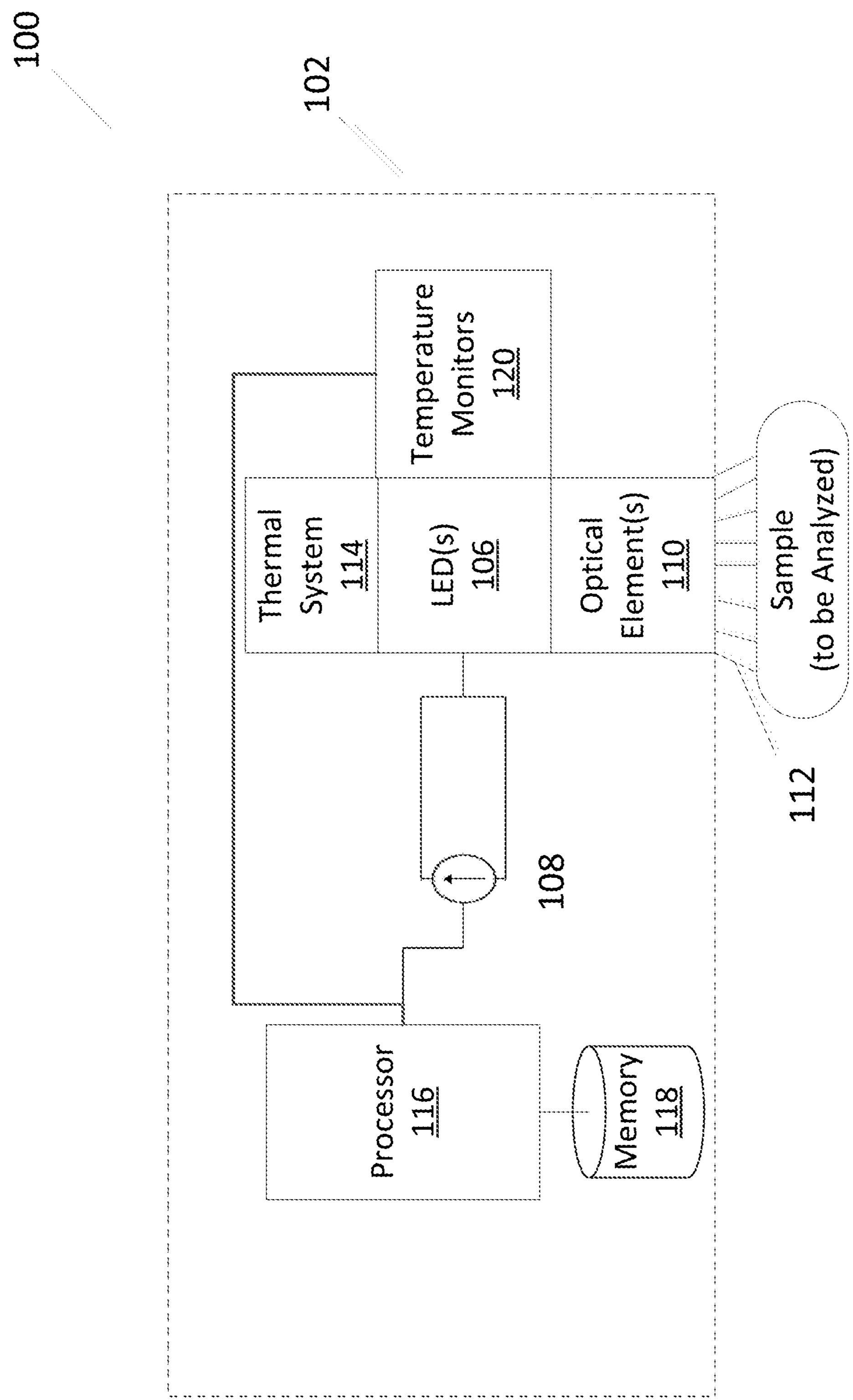
FIG. 1 is a schematic representation of an exemplary solid state illumination device that produces a highly stable output.

FIG. 1 is a schematic diagram of an exemplary solid state illumination device 102 that includes a plurality of LEDs 106, a plurality of controllable electrical current sources 108 (typically one per LED), a plurality of optical elements 110, a plurality of temperature sensors 120 (typically one per LED), a thermal system 114 (to dissipate heat from the LEDs and/or other system 102 components), a computer-based processor 116, and a computer-based memory 118 coupled to the computer-based processor 116.

The solid state illumination device 102 of FIG. 1 combines light from the plurality of LEDs 106 to produce a single output light 112 that has a substantially consistent and/or repeatable optical power level and blend of wavelengths, despite any temperature variations that may occur at or near the LEDs 106 in the solid state illumination device 102. In a typical implementation, the solid state illumination device 102 achieves this by: 1) storing (e.g., in computer-based memory 118) characterizing information (e.g., data and/or mathematical function(s)) that characterize the behavior of each specific LED 106 in the system 102 when exposed to varying temperature conditions, and information (e.g., cutoff frequencies, etc.) that describe the behavior of other optical elements 110 in the solid state illumination device 102), 2) monitoring a temperature associated with each respective one of the LEDs 106 (and, optionally, one or more of the other optical elements 110 in the system 102), and 3) adjusting an electrical current being supplied to one (or more) of the individual LEDs 106 to produce a desired result taking into account a temperature reading for that LED, the characterizing information for that LED, and (optionally) other optical elements 110 in a light path from the LED to the system output 112.

In a typical implementation, the LEDs 106 are configured to produce light at different wavelengths. In this regard, an exemplary system 102 might include one red LED, one green LED, one pumped blue LED, one blue LED, and one ultraviolet (UV) LED. Moreover, the system 102 may be configured to combine and direct light from the multiple LEDs to form a single system output 112. In this regard, the system 102 may include a plurality of optical elements (e.g., lenses, dichroic filters and bandpass filters) to combine and direct the light toward the system output 112.

Figure 2:
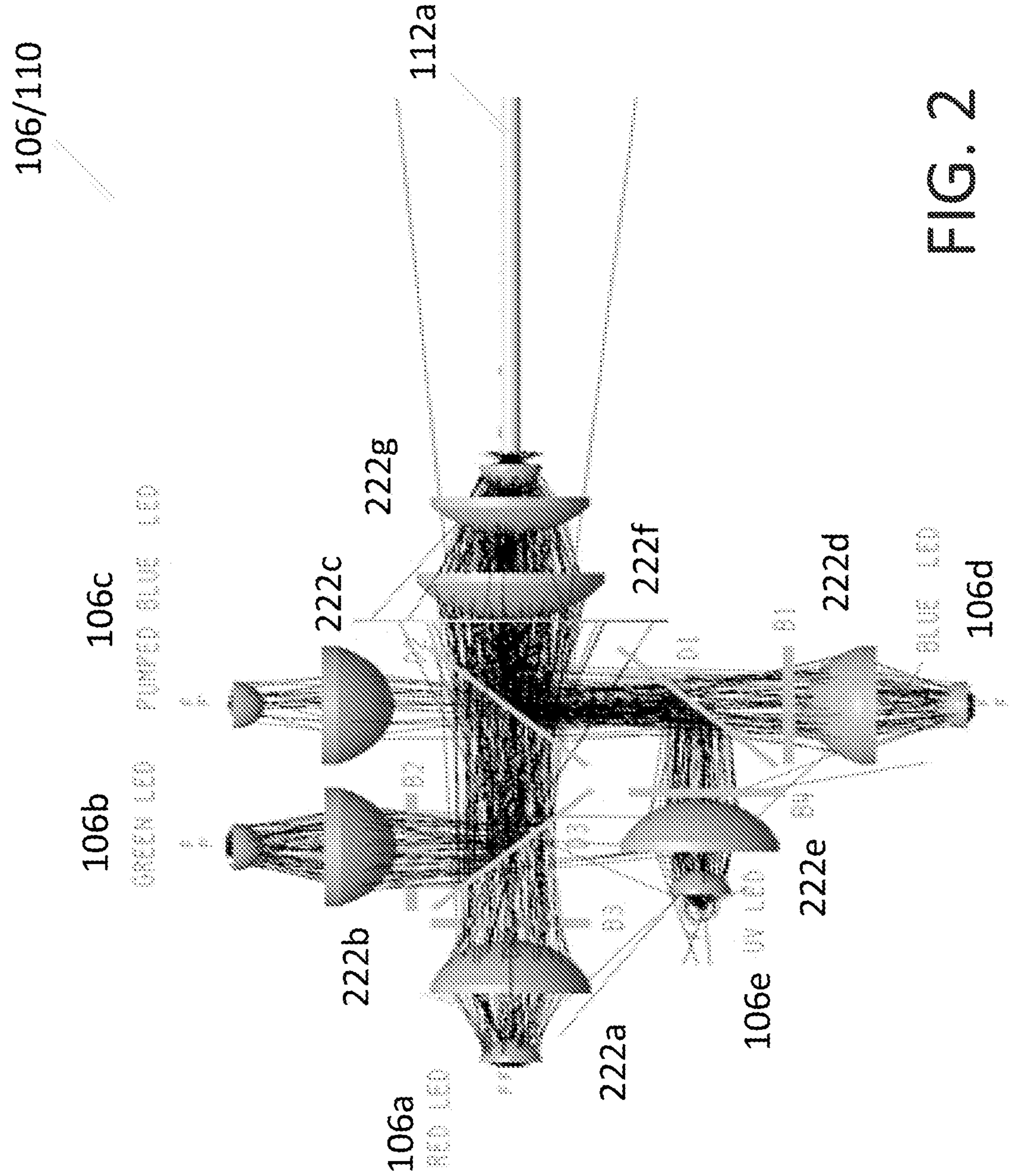
FIG. 2 is a schematic representation showing an exemplary configuration of LEDs and other optical elements in the solid state illumination device of FIG. 1.

FIG. 2 shows an exemplary configuration of LEDs 106 and other optical elements that may be present, for example, in the solid state illumination device 102 in FIG. 1.

More specifically, the illustrated configuration includes five LEDs: one red LED 106*a*, one green LED 106*b*, one pumped blue LED 106*c*, one blue LED 106*d*, and one ultraviolet (UV) LED 106*e*. The other optical elements in the illustrated configuration include condenser lenses 222*a*-222*g*, dichroic filters D1-D3, and bandpass filters B1-B4, arranged as shown, to combine and direct the light from the LEDs 106*a*-106*e* toward and into the system output 112*a*, which, in the illustrated implementation, is a light pipe 112*a*.

According to the illustrated configuration, the red LED 106*a* produces light that passes through condenser lens 222*a*, bandpass filter B3, dichroic filter D3, dichroic filter D2, condenser lenses 222*f* and 222*g*, and into the light pipe 112*a*. The green LED 106*b* produces light that passes through condenser lens 222*b*, bandpass filter B2, is reflected by dichroic filter D3, passes through dichroic filter D2, condenser lenses 222*f* and 222*g*, and into the light pipe 112*a*. The pumped blue LED 106*c* produces light that passes through condenser lens 222*c*, is redirected by dichroic filter D2, passes through condenser lenses 222*f* and 222*g*, and into the light pipe 112*a*. The blue LED 106*d* produces light that passes through condenser lens 222*d*, bandpass filter B1, dichroic filter D1, is reflected by dichroic filter D2, passes through condenser lenses 222*f* and 222*g*, and into the light pipe 112*a*. The UV LED 106*e* produces light that passes through condenser lens 222*e*, bandpass filter B4, is reflected by dichroic filter D1 and by dichroic filter D2, passes through condenser lenses 222*f* and 222*g*, and into the light pipe 112*a*. As such, in the illustrated implementation, all of the light from the LEDs that pass through the other optical elements is combined into the light pipe 112*a*.

During operation, the system 102 utilizes temperature sensors 120 to measure and help monitor local temperatures near each respective one of the LEDs 106. Typically, the system 102 will include at least one temperature sensor 120 for each LED 106. So, if a particular system 102 had five LEDs (as shown in FIG. 2) it typically would have at least five temperature sensors 120. In that kind of configuration, each temperature sensor 120 would be intended (and arranged) to measure a temperature associated with a corresponding one of the LEDs 106. In this regard, each temperature sensor 120 might be located physically closer to the LED 106 it is intended to monitor, than to any other LED 106 in the system 102.

The system represented in FIG. 2, for example, might include five temperature sensors (not shown), one temperature sensor for each respective one of the five LEDs 106*a*-106*e*. Each temperature sensor would be intended to measure a temperature associated with the nearest respective one of the system's LEDs 106*a*-106*e*. More specifically, a first of the temperature sensors might be intended to measure a temperature associated with the red LED 106*a* and, therefore, might be positioned closer to the red LED 106*a* than to any of the other system LEDs. Likewise, a second of the temperature sensors might be intended to measure a temperature associated with the green LED 106*b* and, therefore, might be placed closer to the green LED 106*b* than to any of the other system LEDs. A third of the temperature sensors might be intended to measure a temperature associated with the pumped blue LED 106*c* and, therefore, might be placed closer to the pumped blue LED 106*c* than to any of the other system LEDs. A fourth of the temperature sensors might be intended to measure a temperature associated with the blue LED 106*d* and, therefore, might be placed closer to the blue LED 106*d* than to any of the other system LEDs. A fifth of the temperature sensors might be intended to measure a temperature associated with the UV LED 106*e* and, therefore, might be placed closer to the UV LED 106*e* than to any of the other system LEDs.

In general, each temperature sensor would be positioned close enough to its corresponding LED so as to register any temperature changes that might reasonably relate to a change in optical power or wavelength being produced by the corresponding LED. In some implementations, the distance between each temperature sensor and its corresponding LED may be substantially the same for every temperature sensor/LED combination in the solid state illumination device 102.

The temperature data collected by the temperature sensors 120 is fed back to the system's computer-based processor 116, where it can be used by the system's computer-based processor 116, together with the characterizing information (e.g., the data and/or mathematical functions that describe the behavior of the LEDs in response to changes in temperature, and (optionally) other information about the behavior of other optical components) stored in the computer-based memory 118, to control electrical current being delivered to each respective one of the LEDs so that the power and wavelength of light at the system output 112 remains substantially constant and/or repeatable even as the individual LEDs might experience changes in temperature.

In a typical implementation, the characterizing information for a particular LED (e.g., the data and/or mathematical functions that describe the behavior of the particular LEDs in response to changes in temperature) may be loaded into the computer-based memory 118 of the solid state illumination device 102 at the time the particular LED is going to be added into the solid state illumination device 102. The characterizing information (such as cutoff frequencies, etc.) for any of the other optical components 110 in the solid state illumination device 102 may be pre-loaded into the computer-based memory 118 when the solid state illumination device 102 is initially manufactured, or at any other convenient time.

In a typical implementation, the characterizing data for a particular LED can be obtained by testing, and characterizing the LED with a testing device (e.g., a spectral function generator). In one exemplary implementation, the testing is designed to characterize the LED under consideration by identifying how various optical properties of the LED being tested relate to one another. In this regard, the spectral function generator may characterize how the LED's peak wavelength and optical power level varies with temperature and/or drive current. In one exemplary implementation, the spectral function generator creates this characterization by delivering different levels of electrical current to the LED, under different, controlled (and measured) temperatures, while measuring optical power levels and peak wavelength at each respective current and temperature combination. In some implementations, other data may be collected by the spectral function generator as well.

Figure 3A:
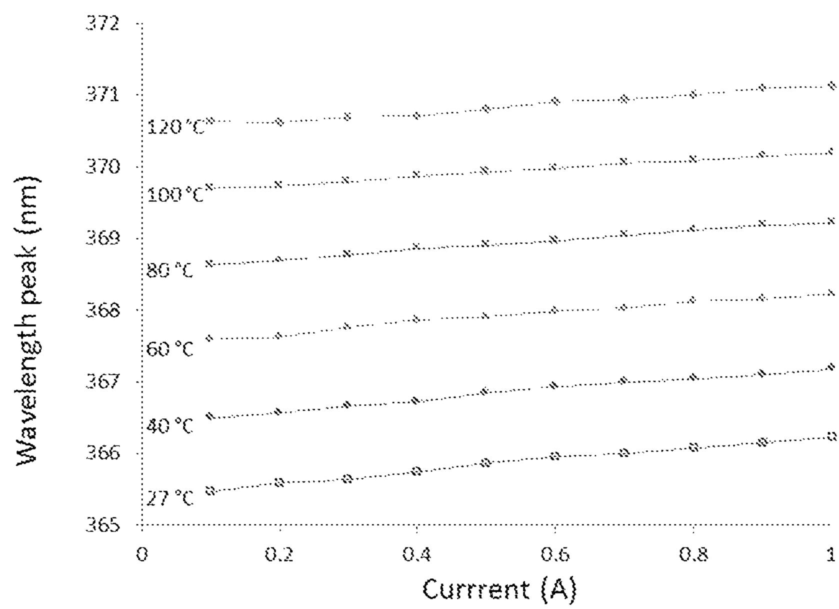
FIGS. 3A and 3B are charts showing one example of data that may result from the characterization of one LED.
Figure 3B:
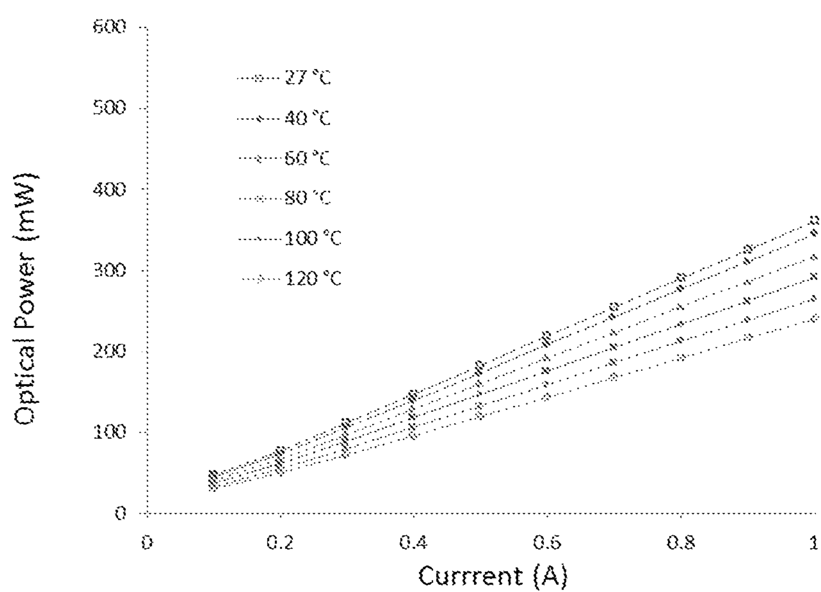

FIGS. 3A and 3B are charts showing one example of data that may result from the characterization of one LED.

In the chart of FIG. 3A, the abscissa (x-axis) represents electrical current (in amperes) delivered to the LED, and the ordinate (y-axis) represents peak wavelength (in nanometers) produced by the LED. There are six lines on the graph, each of which represents the variation in peak wavelength produced as electrical current varies at a particular one of several fixed temperatures: 27° C., 40° C., 60° C., 80° C., 100° C., and 120° C. According to the FIG. 3A chart, at a fixed temperature, the peak wavelength produced by the LED will increase slightly as the electrical current being delivered to the LED is increased. Also, according to the FIG. 3A chart, if the electrical current being delivered to the LED is held steady, then, as temperature increases, so too will the peak wavelength increase.

In the chart of FIG. 3B, the abscissa (x-axis) represents electrical current (in amperes) delivered to the LED, and the ordinate (y-axis) represents optical power (in milliwatts) produced by the LED. There are six lines on the graph, each of which represents the variation in optical power produced as electrical current varies at a particular one of several fixed temperatures: 27° C., 40° C., 60° C., 80° C., 100° C., and 120° C. According to the FIG. 3B chart, at a fixed temperature, the optical power produced by the LED will increase as the electrical current being delivered to the LED is increased. Also, according to the FIG. 3B chart, if the electrical current being delivered to the LED is held steady, then, if temperature increases, so too will the optical power increase.

FIG. 3A and FIG. 3B provide one example of the type of information that the spectral function generator might collect for each one of the LEDs are that going to be placed into the solid state illumination device 102.

In some implementations, the characterizing information for each LED will include a collection of data points, similar to those represented in the charts of FIGS. 3A and 3B. In some implementations, the characterizing information may also, or alternatively, include one or more mathematical functions that describe, in mathematical terms, the behavior of the LED as indicated by the curves on the charts of FIGS. 3A and 3B. These mathematical functions may be derived, for example, by a computer-based processor in the spectral function generator, or in the processor 116 of the solid state illumination device 102. In one exemplary implementation, the computer-based processor that derives the mathematical functions may utilize a curve fitting and/or other techniques or combination or techniques, to derive a curve that fits the collected data, and to define a function that describes the curve. Curve fitting refers generally to a process whereby a curve or mathematical function is constructed that has a good or "best" fit to a series of data points. Curve fitting can involve, for example, interpolation, smoothing, and/or any one or more of a variety of other techniques.

After the LED is tested by the spectral function generator, typically, the LED is placed and connected into the solid state illumination device 102. Placing and connecting the LED into the solid state illumination device 102 typically entails electrically connecting the LED to the solid state illumination device 102 so that the connected LED can contribute, along with any other LEDs in the solid state illumination device 102, to the output light produced by the solid state illumination device 102.

Once a particular LED has been placed into the solid state illumination device 102, and the characterizing data for that particular LED has been loaded into the computer-based memory 118 of the solid state illumination device 102, then that solid state illumination device 102 may use the stored information to effectively control that LED so that the power and wavelength of light at the system output 112 remains substantially constant and/or repeatable even as a temperature associated with that LED might change. Thus, if a change in temperature is recorded by one of the temperature monitors 120 in the solid state illumination device 102, then the solid state illumination device 102 can change the electrical current being delivered to the corresponding LED (and/or one or more other LEDs) by the one or more electrical current sources to compensate for the change in temperature.

Turning back to FIG. 1, the thermal system 114 can be virtually any kind of system that facilitates or provides for cooling of the LEDs 106 and/or other heat generating components in the illumination device 102. In various exemplary implementations, the thermal system can include heat sinks, heat fins, cooling fans, air vents, etc., and/or combinations thereof.

Figure 4:
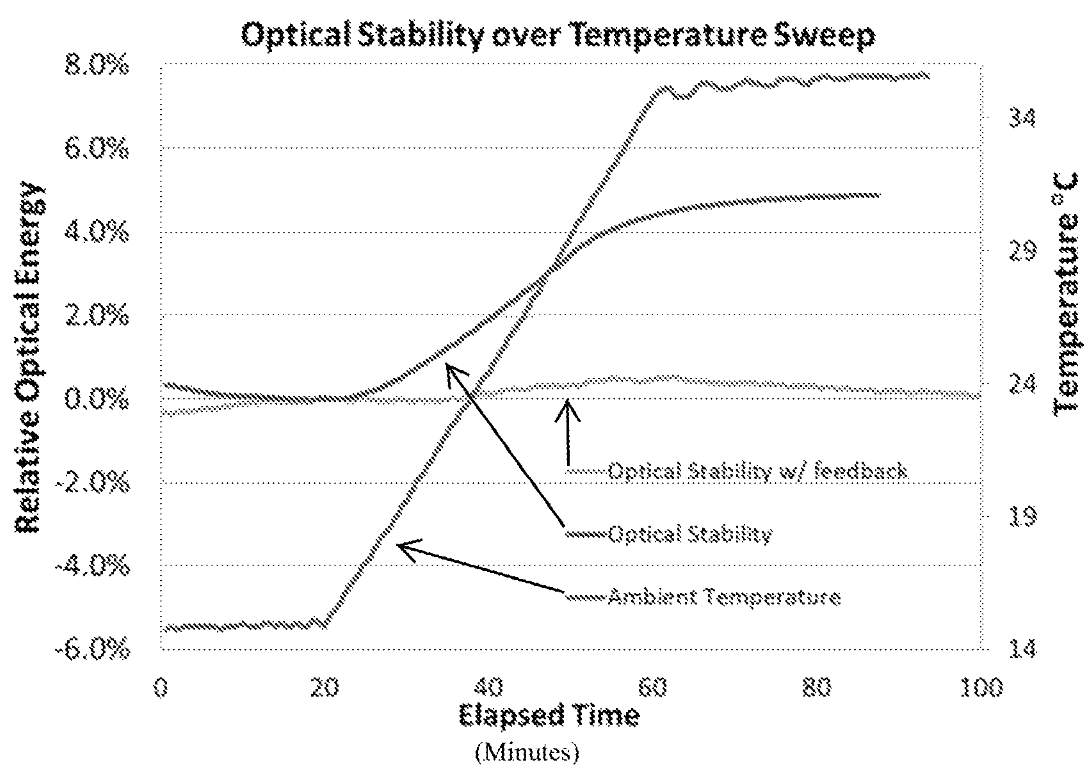
FIG. 4 is a chart that illustrates the effectiveness of a feedback/control system as disclosed herein on maintaining relative optical energy in the output of a solid state optical device.

FIG. 4 is a chart that illustrates the effectiveness of a feedback/control system as disclosed herein on maintaining relative optical energy in the output of a solid state optical device. The abscissa (x-axis) in the chart represents elapsed time, the left side ordinate (y-axis) in the chart represents relative optical energy of the device, and the right side ordinate (y-axis) represents temperature. There are three lines on the chart. One line (labeled, "ambient temperature") represents a change in ambient temperature of approximately 25 degrees Celsius in approximately 40 minutes. A second line (labeled "optical stability") represents the optical stability of an illumination device that does not include the control features or functionalities disclosed herein. This second line illustrates that the optical stability varies approximately 4% when exposed to the indicated temperature change. A third line (labeled "optical stability w/feedback") represents the optical stability of an illumination device that implements the control features and functionalities disclosed herein. This third line indicates that an illumination device that implements the control features and functionalities disclosed herein experiences a negligible amount of variation in relative optical energy when exposed to the indicated temperature change.

Figure 5:
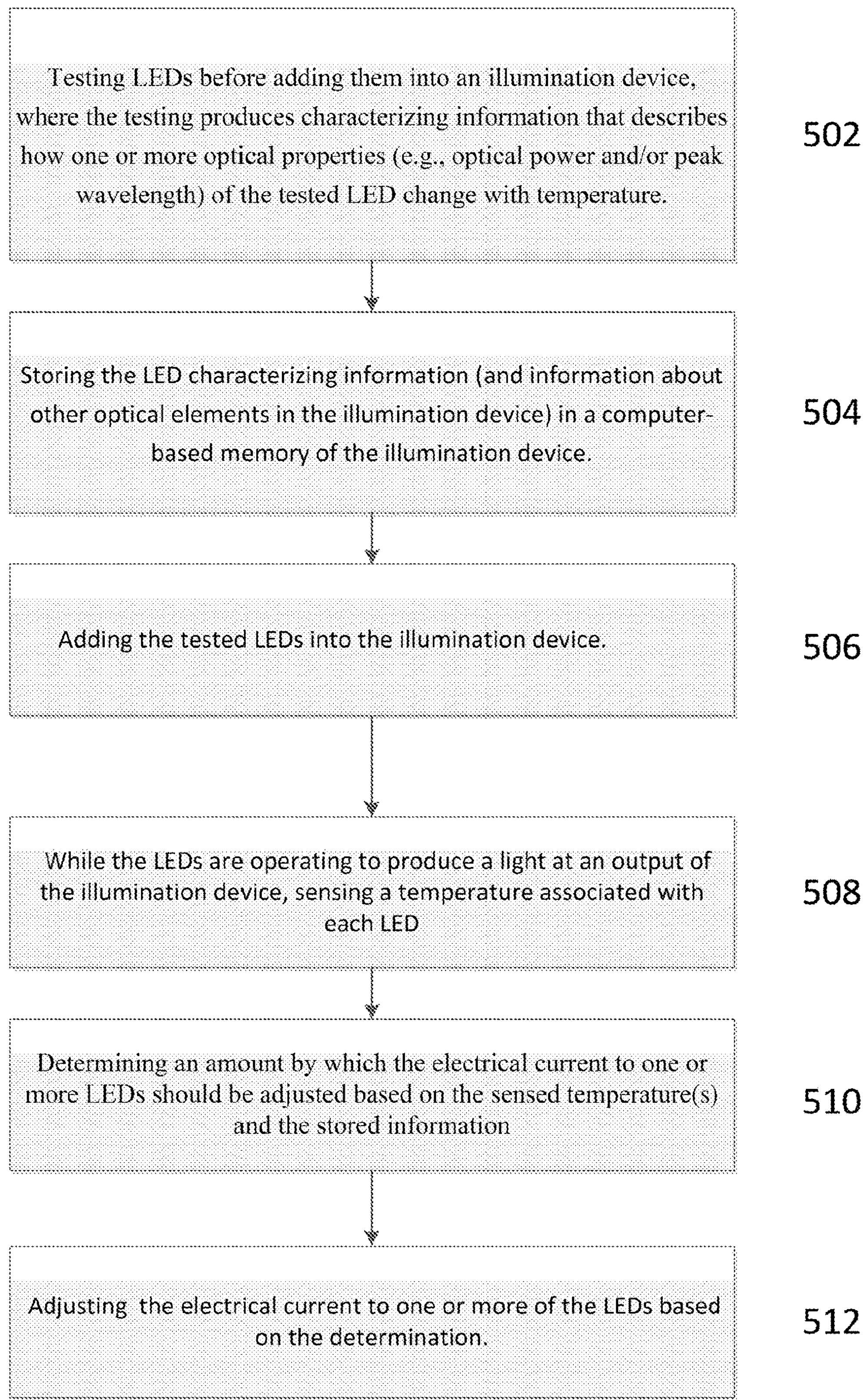
FIG. 5 is a flowchart of an exemplary process that may be performed in connection with the solid state illumination device of FIG. 1 to help maintain a stable optical output.

FIG. 5 is a flowchart of an exemplary process that may be performed in connection with the solid state illumination device 102 of FIG. 1 to help maintain a stable optical output.

The process, according to the illustrated flowchart, includes (at 502) testing LEDs before adding them into an illumination device, where the testing produces characterizing information that describes how one or more optical properties (e.g., optical power and/or peak wavelength) of the tested LED change with temperature.

Next, the process (at 504) includes storing the LED characterizing information (and information about other optical elements in the illumination device) in a computer-based memory of the illumination device.

Next, the process (at 506) includes adding the tested LEDs into the illumination device.

Next, the process (at 508) includes sensing a temperature associated with each LED while the LEDs are operating to produce a light at an output of the illumination device, Next, the process (at 510) includes determining an amount by which the electrical current to one or more of the LEDs should be adjusted based on the sensed temperature(s) and the stored information.

Next, the process (at 512) includes adjusting the electrical current to one or more of the LEDs based on the determination.

What follows is a discussion of some of the mathematical principles and relationships that described how the various concepts discussed herein relate to one another.

The optical power at the output 112 of solid state system 102P (T,I), for each LED 106 (e.g., the red LED) can be expressed (for any values of temperature T and current I) by the following mathematical function:

$$P(T,I)=\int_{\lambda 1}^{\lambda 2} S_{PI}(\lambda,T,I)*\text{TRANS}(\lambda,\ T,I)d\lambda$$

where:

λ represents the LED's wavelength,

I represents the LED's driving current,

T represents a measured temperature associated with the LED $S_{PI}(\lambda, T, I)$ represents spectral intensity of the LED as a function of the LED's wavelength λ, temperature T and driving current I, TRANS (λ, I, T) represents a transmission function (for any band pass filters, dichroic plates, light guides, and/or other optical components in the light path of the LED), and $\lambda_1$ and $\lambda_2$ define a spectral band for the LED light.

A change in output power from the LED, ΔP (T,I), due to a change in temperature ($T-T_0$) can be expressed by the following mathematical function:

$$\Delta P(T,I)=P(T,I)-P(T_0,I)$$

where:

$P(T_0, I)$ represents a default output power at a default ambient temperature, $T_0$ represents the temperature at the default ambient temperature, for example, 5° C., P(T,I) represents an actual output power at an actual temperature, T represents actual temperature, which may be different than the default ambient temperature, and I represents the LED's driving current.

If the output power is to be kept the same as default output $P(T_0, I)$, then the LED driving current can be adjusted accordingly. And:

$$\Delta P(T,\Delta I)=P(T,I+\Delta I)-P(T,I)=\Delta P(T,I)$$

where:

ΔP(T, ΔI) represents a change in power that would result from a change in current, T represents the actual temperature ΔI represents the change in current, P(T, I+ΔI) represents the power would result from the change in current, I represents the actual current P(T,I) represents the actual output power, and ΔP(T,I) represents a change in output power due to a change in temperature.

The temperature compensated output can be defined as:

$$P(T,I+\Delta I)=P(T,I)+\Delta P(T,\Delta I)$$

From this, a change in electrical current to produce a desired ΔP can be derived.

Let: $\{(P(T,\ I+\Delta I)-P(T_0,\ I))/P(T_0,\ I)\}\leq$specified output power stability For: $P(T_i,I_i)=\int_{\lambda 1}^{\lambda 2} S_{PI}(\lambda,T_i,I_i)*\text{TRANS}(\lambda,T_i,I_i)d\lambda$ where $S_{PI}(\lambda, T_\lambda, I_\lambda)$ is light source spectral intensity, $\text{TRANS}(\lambda, T_\lambda, I_\lambda)$ is a system transmission function (where the system, for example, may include a band pass filter, a dichroic plate, and/or a light guide), where in $T_i$: $T_1, T_2 \ldots T_n$, $T_1$ is a PCB temperature (associated with an LED) at a low operation temperature limit and $T_n$ is PCB temperature at the high operation temperature limit.

For example, in one exemplary system, $T_1$ is the PCB temperature (associated with an LED) with ambient temperature at 15° C., $T_0$ is the PCB temperature (associated with an LED), with ambient temperature at 25° C., $T_n$ is $T_3$ the PCB temperature (associated with an LED) with ambient temperature at 35° C.

$I_i$: $I_1, I_2 \ldots I_n$, $I_1$ and $I_n$ are driving currents that may be represented, for example, as percentages of an operational driving current limit. For example, in one exemplary system, $I_i$: 10%, 25%, 50%,75% 100% of the maximum driving current for an LED.

The system, in some implementations, storing all these $P(T_i, I_i)$ in memory, and linearly fits to get an optical output at P(T,I) for any T and I for the specified operation temperature range at different driving currents I.

$$\{(P(T,I+\Delta I)-P(T_0,I))/P(T_0,I)\}\leq\pm 2\%$$

$P(T_0, I)$ is setting power with ambient temperature at 25° C., P(T, I+ΔI) is compensated output power within specified ambient temperature.

A number of embodiments of the invention have been described. Nevertheless, it will be understood that various modifications may be made without departing from the spirit and scope of the invention.

For example, the techniques, devices, systems, and technologies disclosed herein can be used in connection with any one of a variety of different applications. In one exemplary application, the lighting system 100 may be used in a molecular diagnostics application, such as fluorescent microscopy.

The testing of the LEDs can be performed in any one of a variety of different ways.

A particular illumination device or system can have a variety of possible configurations. For example, it can include a different number, combination, and/or arrangement of LEDs. It can include a different number, combination, and/or arrangement of other optical components (e.g., dichroic filters, bandpass filters, light pipes, etc.). It can include virtually any kind of cooling means/thermal system. It can include any number, combination, and/or arrangement of processor and/or memory. The controllable current sources can be virtually any kind of current sources.

In some implementations, the illumination device or system can have fewer or greater than one temperature sensor per LED. In some instances, for example, it may have one temperature sensor per LED, plus one or more ambient sensors. In some instances, one temperature sensor may be associated with more than one LED. Moreover, in some instances, one or more of the LEDs may not have a corresponding temperature sensor.

Of course, the illumination device or system can have other components not specifically mentioned herein.

The illumination device described herein has been described largely as a device. However, the illumination device could be effectively distributed across multiple physical locations, with no common housing containing all of the device components.

In various embodiments, certain aspects of the subject matter disclosed herein can be implemented in digital electronic circuitry, or in computer-based software, firmware, or hardware, including the structures disclosed in this specification and/or their structural equivalents, and/or in combinations thereof. In some embodiments, the subject matter disclosed herein can be implemented in one or more computer programs, that is, one or more modules of computer program instructions, encoded on computer storage medium for execution by, or to control the operation of, one or more data processing apparatuses (e.g., processors). Alternatively, or additionally, the program instructions can be encoded on an artificially generated propagated signal, for example, a machine-generated electrical, optical, or electromagnetic signal that is generated to encode information for transmission to suitable receiver apparatus for execution by a data processing apparatus. A computer storage medium can be, or can be included within, a computer-readable storage device, a computer-readable storage substrate, a random or serial access memory array or device, or a combination thereof. While a computer storage medium should not be considered to include a propagated signal, a computer storage medium may be a source or destination of computer program instructions encoded in an artificially generated propagated signal. The computer storage medium can also be, or be included in, one or more separate physical components or media, for example, multiple CDs, computer disks, and/or other storage devices.

Certain operations described in this specification can be implemented as operations performed by a data processing apparatus (e.g., a processor) on data stored on one or more computer-readable storage devices or received from other sources. The term "processor" encompasses all kinds of apparatus, devices, and machines for processing data, including by way of example a programmable processor, a computer, a system on a chip, or multiple ones, or combinations, of the foregoing The apparatus can include special purpose logic circuitry, e.g., an FPGA (field programmable gate array) or an ASIC (application specific integrated circuit). The apparatus can also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings and described herein as occurring in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Furthermore, some of the concepts disclosed herein can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

Other implementations are within the scope of the claims.

What is claimed is:

1. A method of maintaining a desired optical output in a solid state illumination device, wherein the solid state illumination device is configured to accommodate a plurality of light emitting diodes (LEDs) and to combine light from the plurality of LEDs to produce a single optical output, the method comprising:

testing an LED prior to adding that LED into the solid state illumination device, wherein the testing produces characterizing information that describes how one or more optical properties of the tested LED change with temperature;

storing, in a computer-based memory of the solid state illumination device, the characterizing information for the tested LED;

adding the tested LED into the solid state illumination device;

measuring, with a plurality of temperature sensors, a temperature associated with each respective one of the plurality of LEDs in the solid state illumination device while the solid state illumination device is producing the output light; and adjusting an electrical current to the tested LED in the solid state illumination device based on the measured temperature associated with the tested LED and the stored characterizing information for the tested LED;

storing, in the computer-based memory of the solid state illumination device, information that characterizes one or more optical properties of other optical elements in the solid state illumination device, wherein the other optical elements comprise one or more optical filters in an optical path for each respective one of the plurality of LEDs, wherein the information that characterizes the one or more optical properties of other optical elements in the solid state illumination device comprises cutoff frequencies associated with the one or more optical filters; and determining, with a computer-based processor of the solid state illumination device, an amount by which the electrical current to the tested LED should be adjusted, and wherein the amount by which the electrical current to the tested LED should be adjusted is determined based on the relationship:

$$P(T,I)=\int_{\lambda_1}^{\lambda_2} s_{P1}(\lambda,T,I)*T(\lambda,T,I)d\lambda$$

where:

T represents a measured temperature associated with the tested LED,

I represents the tested LED's driving current,

P(T,I) is power delivered to the optical output by the tested LED, $\lambda$ represents the tested LED's wavelength, $s_{P1}(\lambda,T,I)$ represents a spectral intensity of the tested LED as a function of the LED's wavelength $\lambda$, temperature T and driving current I, $T(\lambda,I,T)$ represents a transmission function (for any optical filters and/or other optical components in a light path of the tested LED), and $\lambda_1$ and $\lambda_2$ define a spectral band for the LED light that reaches the optical output.

2. The method of claim 1, wherein the testing characterizes how the optical power produced by the tested LED changes with temperature and with electrical current being provided to the LED.

3. The method of claim 1, wherein the testing characterizes how the peak wavelength produced by the tested LED changes with temperature and with electrical current being provided to the LED.

4. The method of claim 1, wherein every LED that is added into the solid state lighting device is tested prior to being added into the solid state lighting device, and wherein characterizing information for every tested LED is stored in the computer-based memory of the solid state illumination.

5. The method of claim 1, further comprising:

applying light from the optical output to an application relating to molecular diagnostics.

6. A solid state illumination device comprising:

a plurality of light emitting diodes (LEDs) configured to produce light at different wavelength ranges;

a plurality of controllable electrical current sources, wherein each electrical current source is configured to provide electrical current to a corresponding one of the LEDs;

a plurality of other optical elements arranged to filter and/or direct light from each respective one of the plurality of light emitting diodes along a corresponding light path to a single optical output of the illumination system;

a plurality of temperature sensors, wherein each temperature sensor is configured to measure a temperature associated with a corresponding one of the LEDs;

a computer-based memory that stores characterizing information that describes how one or more optical properties of each respective one of the LEDs in the solid state illumination device change with temperature; and a computer-based processor configured to:

determine, based on one or more temperature measurements and based on the characterizing information for one or more of the LEDs, an amount by which electrical current to a LED should be adjusted in view of a change in temperature; and cause a corresponding one of the controllable electrical current sources to adjust the electrical current to a corresponding one of the LEDs based on the determination, wherein the computer-based memory of the solid state illumination device stores information that characterizes one or more optical properties of the other optical elements in the solid state illumination device, wherein the other optical elements comprise one or more optical filters in an optical path for each respective one of the plurality of LEDs, wherein the information that characterizes the one or more optical properties of other optical elements in the solid state illumination device comprises cutoff frequencies associated with the one or more optical filters, and wherein the amount by which the electrical current to the tested LED should be adjusted is determined, by the computer-based processor, based on the relationship:

$$P(T,I)=\int_{\lambda_1}^{\lambda_2} s_{P1}(\lambda,T,I)*T(\lambda,T,I)d\lambda$$

where:

T represents a measured temperature associated with the tested LED,

I represents the tested LED's driving current,

P(T,I) is power delivered to the optical output by the tested LED, $\lambda$ represents the tested LED's wavelength, $s_{P1}(\lambda,T,I)$represents a spectral intensity of the tested LED as a function of the LED's wavelength $\lambda$, temperature T and driving current I, $T(\lambda,I,T)$ represents a transmission function (for any optical filters and/or other optical components in a light path of the tested LED), and $\lambda_1$ and $\lambda_2$ define a spectral band for the LED light that reaches the optical output.

7. The solid state illumination device of claim 6, wherein every LED in the solid state illumination system has been tested prior to being added into the solid state illumination device, and wherein the testing produced the characterizing information that was stored in the computer-based memory of the solid state illumination device.

8. The solid state illumination device of claim 6, wherein the temperature sensors measure temperature while the solid state illumination device is producing the output light.

9. The solid state illumination device of claim 6, wherein the characterizing information describes how the optical power produced by each LED in the solid state illumination device will change with temperature and with electrical current being provided to the LED.

10. The solid state illumination device of claim 6, wherein the characterizing information describes how a peak wavelength produced by each LED in the solid state illumination device will change with temperature and with electrical current being provided to the LED.

11. The solid state illumination system of claim 6 applied to an application relating to molecular diagnostics.

12. The method of claim 1, wherein adjusting the electrical current to the tested LED in the solid state illumination device is without regard to any optical sensor feedback data.

13. The method of claim 1, wherein measuring the temperature associated with each respective one of the plurality of LEDs comprises using one temperature sensor for each LED.

14. The method of claim 1, the method further comprising maintaining a consistent optical output for each respective one of the LEDs through a corresponding one of the filters.

15. The method of claim 14, wherein each of the filters is a bandpass filter.

16. The solid state illumination system of claim 6, wherein the computer-based processor is configured to determine an amount by which electrical current to each LED should be adjusted without regard to any optical sensor feedback data.

17. The solid state illumination system of claim 6, wherein the plurality of temperature sensors comprises one temperature sensor for each LED.

18. The solid state illumination system of claim 17 configured to maintain a consistent optical output for each respective one of the LEDs through a corresponding one of the filters.

19. The solid state illumination system of claim 18, wherein each of the filters is a bandpass filter.

* * * * *